(12) United States Patent
Fu et al.

(10) Patent No.: US 6,803,291 B1
(45) Date of Patent: Oct. 12, 2004

(54) METHOD TO PRESERVE ALIGNMENT MARK OPTICAL INTEGRITY

(75) Inventors: Shih-Chi Fu, Taipei (TW); Feng-Jia Shih, Hsin-Chu (TW); Chia-Tung Ho, Taipei (TW); Chih-Ta Wu, Hsinchu (TW); Ching-Sen Kuo, Taipei (TW); Jieh-Jang Chen, Hsinchu (TW); Gwo-Yuh Shiau, Hsinchu (TW); Chia-Shiung Tsia, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/394,089

(22) Filed: Mar. 20, 2003

(51) Int. Cl.[7] ............................................. H01L 21/76
(52) U.S. Cl. ....................................... 438/401; 257/797
(58) Field of Search ............................... 438/401, 462, 438/700, 975; 257/797

(56) References Cited

U.S. PATENT DOCUMENTS 5,889,335 A * 3/1999 Kuroi et al. ................. 257/797

* cited by examiner

Primary Examiner—David Nelms
Assistant Examiner—David Vu
(74) Attorney, Agent, or Firm—Tung & Associates

(57) ABSTRACT

A method for protecting an alignment mark area during a CMP process including forming at least a first material layer over a process surface of a semiconductor wafer including active areas and alignment mark trenches formed in the at least one alignment mark area; forming at least a second material layer over the first material layer including the active areas and the at least one alignment mark area; lithographically patterning and etching the at least a second material layer to form at least a plurality lines of the at least a second material layer adjacent to the alignment mark trenches; and, carrying out a CMP process to remove at least a portion of the at least a second material layer.

20 Claims, 4 Drawing Sheets

METHOD TO PRESERVE ALIGNMENT MARK OPTICAL INTEGRITY

FIELD OF THE INVENTION

This invention generally relates to semiconductor processing methods including photolithographic patterning and more particularly to a method for replicating alignment marks and preserving the optical signal integrity of alignment marks following an oxide CMP process.

BACKGROUND OF THE INVENTION

In the integrated circuit industry today, hundreds of thousands of semiconductor devices are built on a single chip. Every device on the chip must be electrically isolated to ensure that it operates independently without interfering with another. With the high integration of the semiconductor devices, the accuracy of formation of feature patterns overlying a previously defined semiconductor device level is increasingly difficult as critical dimensions shrink. Overlay accuracy, also referred to as registration is critical to proper functioning of a semiconductor device. To successfully pattern an overlying feature level on the wafer, the wafer feature pattern must be accurately aligned with a newly applied pattern image included in a reticle for proper transfer of the image to the photoresist layer on the wafer.

In forming the various levels of a multi-level semiconductor device including shallow trench isolation features, semiconductor wafer alignment for positioning the semiconductor wafer for subsequent device feature patterning is critical. In a typical photolithographic patterning procedure, an automated stepper, for example, an ASM Lithography photo system sequentially positions the wafer beneath a photoimaging system for transferring a patterned photoimage of device features formed a reticle to expose a photoresist material overlying the semiconductor wafer surface. As positioning of the process wafer is critical for forming semiconductor features, methods for forming and preserving alignment marks to provide the necessary optical contrast have evolved to reduce optical alignment errors during the optical signal sensing and alignment process during photolithography.

Several wafer alignment strategies exist for using different patterns and locations to achieve the alignment of a semiconductor wafer to a reticle containing an image to be transferred to the wafer. These strategies vary from alignment marks located between shot sites (also known as chip sites) to global alignment marks located in two shot sites at the periphery of the wafer. There are also global strategies in which the alignment marks are located between shot sites in the more peripheral regions of the wafer. The overlay accuracy required for proper alignment, frequently referred to as an overlay budget is about one-third of the critical dimension. As device technologies scale to about 0.10 microns and below, conventional method for forming and replicating alignment marks are no longer sufficiently accurate.

In one approach for global alignment, at least two areas at the wafer periphery are selected, typically located on opposite sides of the wafer diameter and include a series of parallel trenches covering a rectangular or square area of about 50 square microns to about 400 square microns referred to as zero-level alignment marks that are etched into the silicon wafer before other processing steps. The global alignment marks are subsequently replicated in each subsequent level of manufacturing a multi-level semiconductor device.

Shallow trench isolation (STI) is a preferred electrical isolation technique especially for a semiconductor chip with high integration. STI features can be made using a variety of methods including, for example, the Buried Oxide (BOX) isolation method for shallow trenches. The BOX method involves filling the trenches with a chemical vapor deposition (CVD) silicon oxide ($SiO_2$), also referred to as an STI oxide which is then chemically mechanically polished (CMP) to remove the overlying layer of STI oxide to yield a planar surface. The shallow trenches etched for the BOX process are anisotropically plasma etched into the substrate, for example, silicon, and are typically between 0.3 and 1.0 microns deep.

Broadly speaking, conventional methods of producing a shallow trench isolation feature include forming a hard mask, for example silicon nitride, over a semiconductor substrate followed by photolithographically patterning and anisotropically etching STI trench features into the semiconductor substrate. Subsequently, the STI trenches are backfilled with $SiO_2$ also referred to as an STI oxide by a CVD process followed by a chemical mechanical polish (CMP) process to polish back the STI oxide to define oxide filled STI trenches. Alignment mark areas on the wafer process surface undergo parallel processing including deposition of an STI oxide layer and are replicated for subsequent wafer alignment according to prior art processes by clearing out the STI oxide over the alignment mark areas prior to CMP. For example, the relative contrast of the alignment marks which are detected by an auto-imaging system using for example, a Helium-Neon laser having a wavelength between about 500 nm to about 630 nm is generally unaffected by dielectric films transparent in this wavelength range which present little interference with reflections from an underlying alignment mark area, typically having a higher extinction coefficient material to provide contrast producing reflections. During the processing of several levels in a multi-level semiconductor device, the alignment mark areas frequently are covered with high extinction coefficient materials such as SiGe, silicon carbide (e.g., SiC), silicon oxynitride (e.g. SiON), metal salicides, polysilicon, and metallic layers. While the alignment mark trenches are frequently not completely covered thereby losing their definition, the sharpness of the definition is decreased. As overlay budgets approach 20 to 30 nanometers for 0.10 micron critical dimensions and lower, a small decrease in the definition of the alignment marks by overlayers of high extinction coefficient materials is increasingly detrimental to overlay accuracy. In many cases an additional step to photolithographically pattern and etch the alignment mark area is economically prohibitive in terms of process cycle time and material cost.

For example referring to FIG. 1A are shown STI trenches e.g., 12A, 12B, and 12C formed through the thickness of a hard mask layer 14, for example silicon nitride (e.g., $Si_3N_4$), and underlying pad oxide layer (not shown), and into a silicon substrate 10. Adjacent the STI trenches is shown a portion of an alignment mark area including alignment mark trenches e.g., 16A and a portion of alignment mark trench 16B, the trenches formed by etching the silicon substrate 10 prior to other processing steps including forming the overlying silicon nitride layer 14. It will be appreciated that although the structures are depicted as adjacent one another, that the STI trenches and alignment mark trenches are typically separated on the wafer process surface as indicated by lines e.g., 13.

Referring to FIG. 1B, an STI oxide layer 18 is deposited over the process surface followed by a photolithographic patterning process to form a protective photoresist layer e.g., 20 to cover active areas including STI trench areas overlying the STI trenches e.g., 12A, 12B, and 12C and exposing areas of the STI oxide layer on the process surface including the wafer alignment mark areas. For example, frequently a reverse mask etch process is carried out to remove a portion of the STI oxide layer 18 overlying relatively featureless areas of the process surface to improve a subsequent CMP polishing uniformity. Referring to FIG. 1C, the STI oxide overlying the alignment mark areas including trenches 16A and 16B is frequently removed in the reverse mask etch process while leaving the STI oxide layer 18 and protective photoresist layer e.g. 20 overlying the STI trench area.

Referring to FIG. 1D, after removing the protective photoresist layer e.g., 20, an oxide CMP process is then carried out to remove the STI oxide layer 18 overlying the STI trench areas. During the oxide CMP process, however, the silicon nitride layer 14 is either thinned or completely polished through in areas around the alignment trenches, for example at corner portions, e.g., 16C of the alignment trenches, undesirably degrading the optical contrast of the alignment marks. Further, a subsequent hot phosphoric acid etching process to remove the silicon nitride layer 14 may result in undesired etching of an underlying material, for example a silicon substrate or other etching susceptible layer, for example if an underlying pad oxide layer overlying a silicon substrate is partially removed in the CMP process. For example, designs of various memory and logic devices, for example flash memory, incorporate an etching susceptible layer underlying a relatively thinner silicon nitride to maintain an STI trench aspect ratio. To prevent the STI oxide CMP process from polishing through or unacceptably thinning the corner portions of the alignment trenches, hard mask layers such as silicon nitride are required to be thick enough to survive the STI oxide CMP process. For example, the thicker the oxide layer and the longer the oxide polishing process required, the greater the potential of preferential polishing over the alignment mark area requiring a thicker hard mask layer. As a result, methods of the prior art for preserving and replicating alignment marks limits the design thickness of layers, for example both hard mask layers and oxide layers in the design of various logic and memory devices in order to prevent degrading the alignment mark area optical contrast during and following a CMP process.

Therefore, there is a need in the semiconductor processing art to develop an improved method for replicating alignment marks to preserve optical contrast integrity thereby improving overlay accuracy in semiconductor wafer photolithography and allowing a greater degree of freedom in design of film stacks in a semiconductor device design process.

It is therefore an object of the invention to an improved method for replicating alignment marks to preserve optical contrast integrity thereby improving overlay accuracy in semiconductor wafer photolithography and allowing a greater degree of freedom in design of film stacks in a semiconductor device design process including overcoming other shortcomings of the prior art.

SUMMARY OF THE INVENTION

To achieve the foregoing and other objects, and in accordance with the purposes of the present invention, as embodied and broadly described herein, the present invention provides a method for protecting an alignment mark area during a CMP process.

In a first embodiment, the method includes forming at least a first material layer over a process surface of a semiconductor wafer including active areas and alignment mark trenches formed in the at least one alignment mark area; forming at least a second material layer over the first material layer including the active areas and the at least one alignment mark area; lithographically patterning and etching the at least a second material layer to form at least a plurality lines of the at least a second material layer adjacent to the alignment mark trenches; and, carrying out a CMP process to remove at least a portion of the at least a second material layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained in exemplary implementation with respect to a process for forming flash memory devices, it will be appreciated that the method of forming protective dummy lines within and around alignment mark areas according to embodiments of the present invention may be used in any semiconductor manufacturing process where the alignment marks are advantageously protected from preferential polishing in a CMP process. For example, the method of the present invention of forming at least one of guard rings and dummy alignment mark lines, preferably at least one guard ring and dummy alignment mark lines may advantageously be used in the formation of for example, CMOS image sensors and DRAM/MIM stacked capacitor packages where a relatively thick oxide layer is at least partially removed, preferably substantially removed over at least the alignment mark area prior to a CMP process.

The method of the present invention is explained by illustrating the parallel effect of exemplary processing steps of active areas of a semiconductor process wafer on alignment mark areas, for example global alignment mark areas (fields) disposed at peripheral portions of the semiconductor process wafer. For example, the method of the present invention is explained with reference to the parallel effects of active area processing on alignment mark areas in connection with the formation of shallow trench isolation (STI)

features and subsequent processing steps used for forming CMOS semiconductor features. The term 'active areas' as used herein refers to areas of the semiconductor process surface where electrically active areas are formed for forming integrated circuit components of a semiconductor device. The term 'anisotropic etching' refers to plasma enhanced etching, for example reactive ion etching (RIE).

Figure 1A:
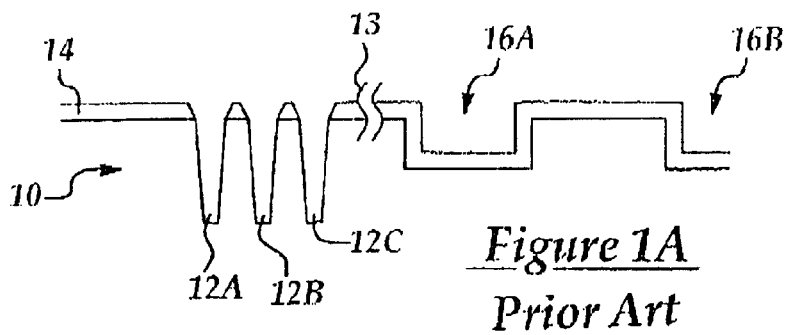
FIGS. 1A-1D are side view representations of an STI trench area and an alignment mark area undergoing an STI trench formation process according to the prior art.
Figure 1B:
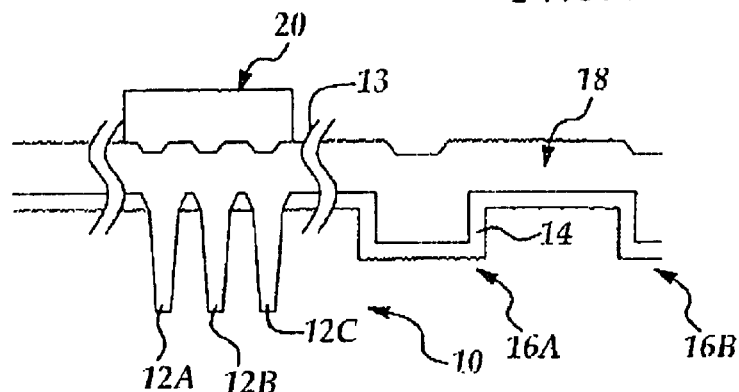
Figure 1C:
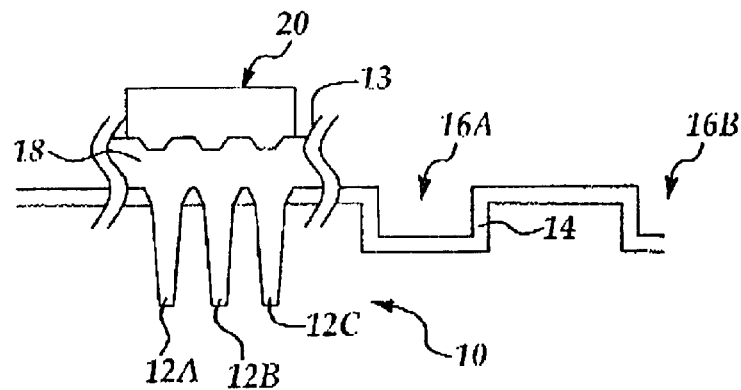
Figure 1D:
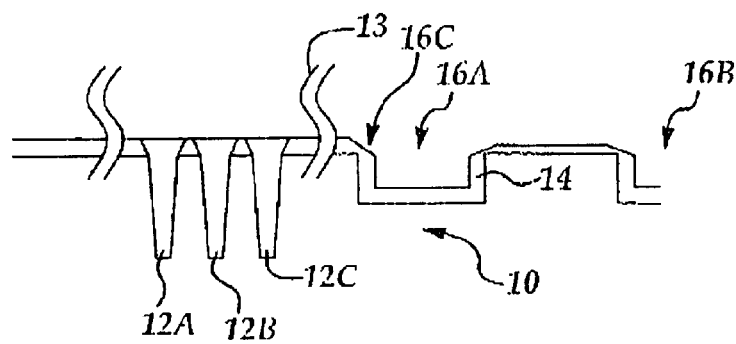
Figure 2A:
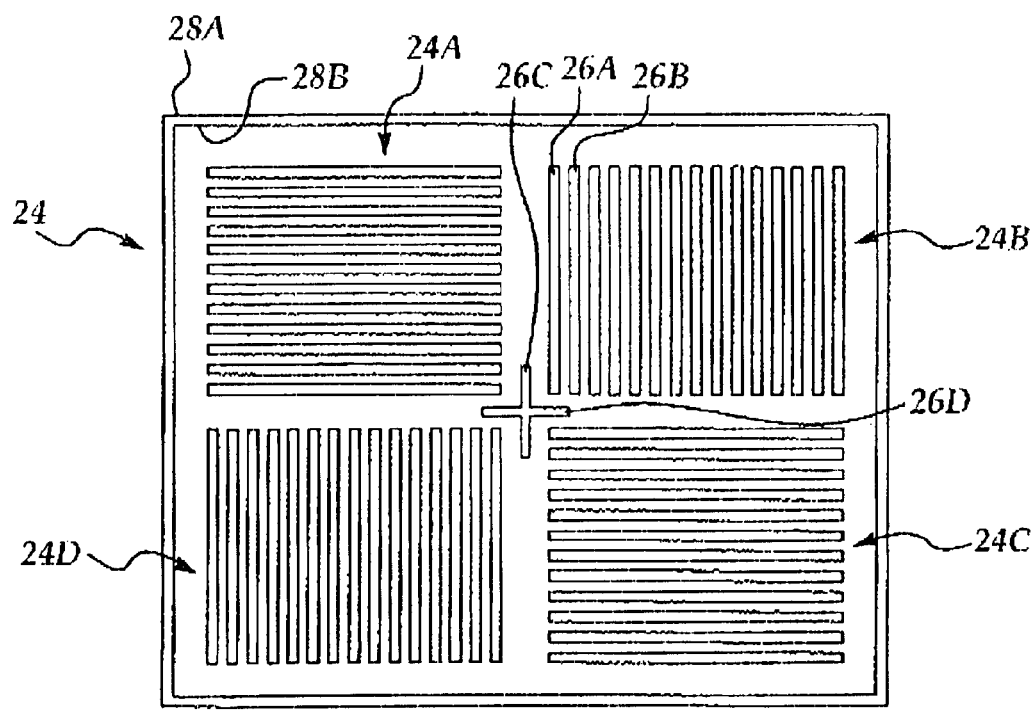
FIG. 2A is a top planar view of an exemplary semiconductor wafer alignment mark area according to an embodiment of the present invention.

For example, referring to FIG. 2A is shown a top planar view an exemplary alignment mark area, 24, having four quadrants of parallel trenches e.g., 24A, 24B, 24C, 24D the trenches in each quadrant formed at right angles with respect to adjacent trenches within the alignment mark area. For example, the alignment mark area 24 comprises a rectangular area having a dimension of about 0.4 mm by 0.4 mm located in non-active areas of the process wafer surface, for example global alignment mark areas disposed at the process wafer periphery. It will be appreciated that the quadrants of the alignment mark area e.g., 24A, 24B, 24C, 24D may contain varying numbers of parallel trenches depending on the lithographic stepper and optical sensing method used. It will also be appreciated that the linewidth (trench width) and the pitch (spacing between individual lines) of the lines (trenches) e.g., 26A, 26B may vary depending on the optical sensing and illuminating wavelength used. It will further be appreciated that an alignment mark area size may vary depending on the optical stepper or optical sensing method in use over an area of about 50 square microns to about 400 square microns and may formed in configurations other than four quadrants, for example adjacently disposed segments of trenches preferably having the parallel trenches in each segment oriented at right angles with respect to the trenches in an adjacent segment. The alignment mark area 24 may optionally include intersecting trenches e.g., 26C and 26D separating the four alignment mark quadrants e.g., 24A, 24B, 24C, 24D.

Preferably, a Michelson laser heterodyne interferometer method using a He-Ne laser as the light source is used for wafer alignment. For example, the linewidths and pitch of lines (trenches) e.g., 26A, 26B, are about 10 microns to about 20 microns, for example having a linewidth of about 16 microns and a pitch of about 17.6 microns. The alignment mark trenches e.g., 26A, 26B, making up the alignment marks, are preferably zero level alignment marks, formed by a photolithographic patterning and anisotropic etching process carried out on the semiconductor wafer process surface prior to other processes, for example the deposition of hardmask or polysilicon layers overlying the semiconductor substrate. Preferably, at least one guard ring, according to an embodiment of the invention, more preferably at least two guard rings e.g., 28A and 28B are formed in an overlying oxide layer surrounding the alignment mark area 24 to surround e.g., alignment mark quadrants 24A, 24B, 24C, 24D, as detailed in an exemplary formation process below. Alignment mark dummy lines are alternatively, more preferably formed in addition to the guard rings e.g., 28A and 28B in an overlying oxide layer adjacent to the alignment mark trenches e.g., 26A, 26B as detailed in an exemplary formation process below.

Figure 2B:
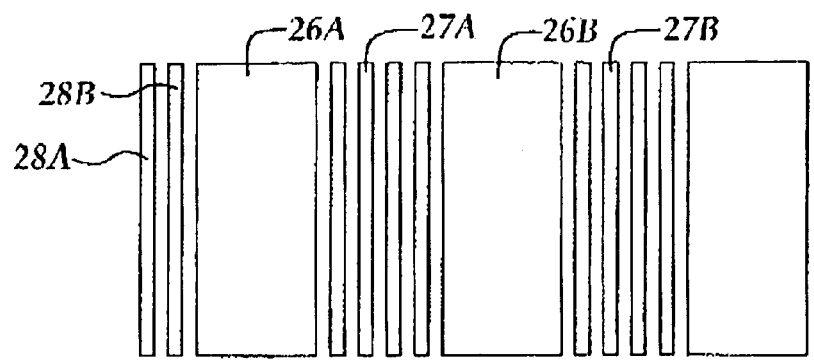
FIG. 2B is an expanded to planar view of an exemplary semiconductor wafer alignment mark area according to an embodiment of the present invention.

For example, referring to FIG. 2B, is shown a top planar view of an expanded portion of the exemplary alignment mark area 24 showing e.g., alignment mark trenches e.g., 26A and 26B, and a plurality of alignment mark dummy lines e.g., 27A and 27B formed adjacent to alignment mark trenches 26A and 26B. The alignment mark dummy lines and the guard rings e.g., 28A an 28B are photolithographically patterned and formed in an oxide layer, for example an STI oxide layer, overlying the alignment mark area prior to an oxide CMP process to remove at least a portion of the oxide layer. For example, the line width of the guard ring lines and the alignment mark dummy lines are preferably formed having a linewidth of from about 0.2 microns to about 0.6 microns, more preferably about 0.4 microns with a pitch having a factor of about 2 to about 4 times the linewidth, for example about 1.2 microns. It will be appreciated that the linewidth of the dummy lines may be varied depending on the line width of the alignment mark trenches. Preferably, the linewidths and pitch of the alignment mark dummy lines are sized to allow the formation of from about 2 to 8 of the alignment dummy marks between and adjacent to each alignment mark trench. The guard rings e.g., 28A and 28B may be formed with the same linewidth and pitch or a different linewidth and pitch as the alignment mark dummy lines e.g., 27A and 27B.

The alignment mark dummy lines may are preferably formed as a single set of parallel lines but may be formed as multiple segments of parallel lines formed adjacent to one another and adjacent to the alignment trenches. Preferably, the alignment mark dummy lines are formed as a single segment of parallel lines extending adjacent the alignment trenches along least one-half of the length of the alignment trenches, more preferably at least three-quarters of the length of the alignment mark trenches. Preferably, the alignment mark dummy lines are formed by a conventional photolithographic process by patterning a photoresist layer and anisotropically etching an underlying material layer, for example, an oxide layer overlying the alignment mark area prior to a subsequent CMP planarization process to remove at least a portion of the underlying material layer. For example, the patterns for the alignment dummy marks and guard rings may be formed in a photomask (reticle) by conventional means, for example direct writing of the patterns onto pre-existing or newly developed photomasks.

Figure 2C:
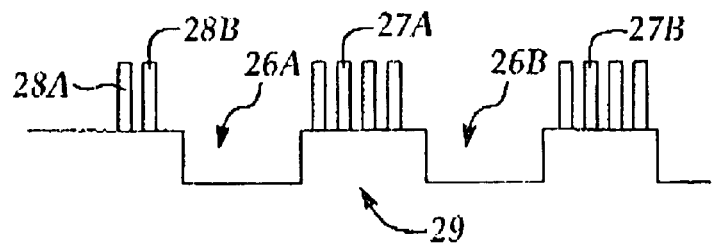
FIG. 2C is an expanded cross sectional side view of an exemplary semiconductor water alignment mark area according to an embodiment of the present invention.

Referring to FIG. 2C, is shown an expanded cross sectional side view representation of a portion of the alignment mark area 24 showing e.g., alignment mark trenches 26A and 26B formed in substrate 29 and showing alignment mark dummy lines, e.g., 27A, 27B, formed adjacent to the alignment mark trenches and guard rings e.g., 28A and 28B surrounding the alignment mark area 24 and formed in an overlying layer, for example an oxide layer overlying the alignment mark area according to a photolithographic patterning and anisotropic etching process prior to carrying out a CMP process to remove at least a portion of the oxide layer.

Figure 3A:
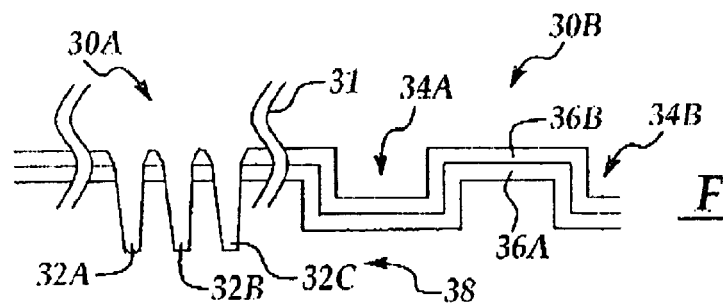
FIGS. 3A-3E are cross sectional side views of an exemplary alignment mark area shown in juxtaposition to an active device area at different stages of an exemplary semiconductor device manufacture process according to an embodiment to the present invention.

In an exemplary implementation of an embodiment of the present invention, referring to FIG. 3A, is shown an exemplary process for forming STI features in connection with the formation of a flash memory device, referred to as self-aligned floating gate flash device. Shown is a shallow trench isolation (STI) area 30A having an anisotropically etched trenches e.g., 32A, 32B, and 32C formed in an active area of the wafer process surface, for example formed by a conventional photolithographic and anisotropic etching process to form trenches extending through the thickness of silicon nitride layer 36B (e.g., $Si_3N_4$) and underlying polysilicon layer 36A into semiconductor substrate, e.g., silicon wafer 38. A pad oxide layer (not shown) is preferably formed over the silicon substrate 38 prior to forming the polysilicon layer 36A. It will further be appreciated that a silicon oxynitride (e.g., SiON) layer (not shown) is optionally formed over the silicon nitride layer 36B. For example the thickness of the polysilicon layer 36A is preferably formed at a thickness of about 500 Angstroms to about 800 Angstroms and the silicon nitride layer 36B including an optional overlying silicon oxynitride layer is formed at a thickness of from about 1500 Angstroms to about 2500 Angstroms. For example, the thickness of the silicon nitride layer 36B is thinner in the formation of a flash memory device according to an embodiment of the invention, for example about 1600 Angstroms, compared to a conventional logic device due to the formation of underlying polysilicon layer 36A which limits the thickness of the silicon nitride layer 36B in order to achieve a desired aspect ratio of the subsequently etched STI trenches e.g., 32A, 32B, and 32C.

Still referring to FIG. 3A, shown adjacent to the STI area 30A is shown a portion of an alignment mark area 30B showing an exemplary alignment mark trench 34A and a portion of an adjacent alignment mark trench 34B. The lines e.g., 31 indicate that the STI trench area 30A and the alignment mark area 30B are separated in space on the wafer surface although shown juxtaposed to one another other to illustrate parallel processing effects.

Figure 3B:
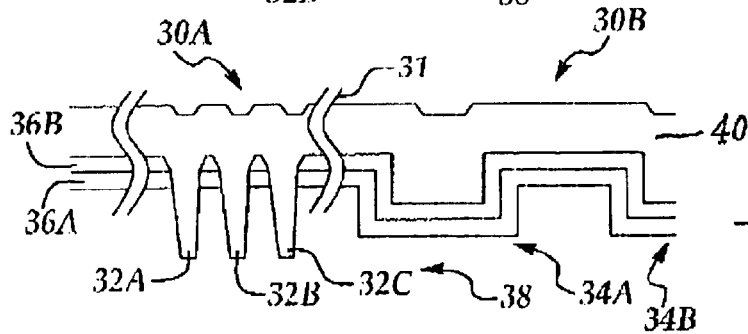

Referring to FIG. 3B, a layer 40 of CVD silicon oxide (e.g. $SiO_2$) also referred to as an STI oxide is deposited by a plasma enhanced CVD process, for example HDP-CVD, to a thickness of about 5000 Angstroms to about 8000 Angstroms over the silicon nitride layer 36B filling the STI trenches and the alignment mark trenches. It will be appreciated that other deposition methods such as spin on methods or APCVD process may be used as well to form the STI oxide layer.

Figure 3C:
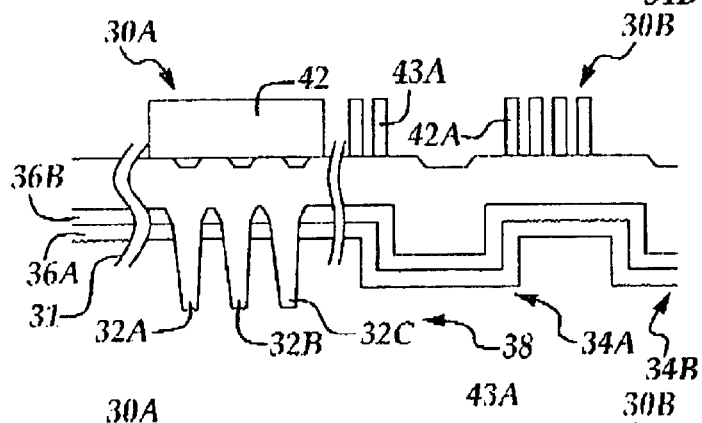

Referring to FIG. 3C, in an embodiment of the method according to the preset invention a photolithographic patterning process is carried out to form a protective photolitliograpic layer 42 patterned to cover the STI trench area 34B and cover alignment mark dummy line areas e.g., 42A and guard ring areas e.g., 43A adjacent to the alignment trenches e.g., 30A and 30B, according to preferred embodiments.

Figure 3D:
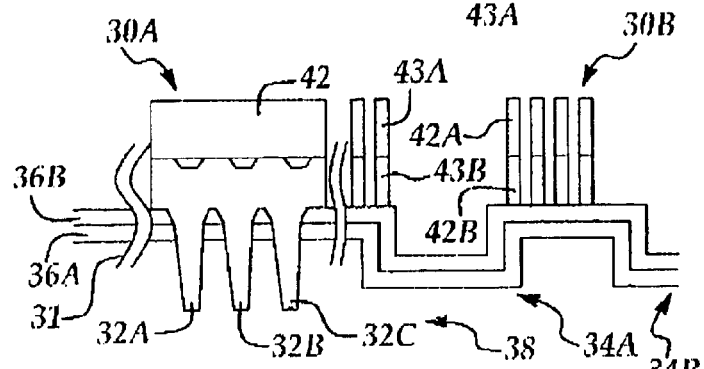

Referring to FIG. 3D, a wet or dry etching process, preferably a dry etching process is carried out to anisotropically etch the STI oxide layer 40 according to the patterned photoresist layer 42 to form alignment mark dummy lines e.g., 42B and guard rings, e.g., 43B over the alignment mark area 30B. Preferably, the dry etching process is carried out in parallel with a reverse mask process carried out to remove at least a portion of the STI oxide layer over non-active areas of the process wafer to speed a subsequent oxide CMP process and to improve a polishing uniformity over active regions of the wafer.

Figure 3E:
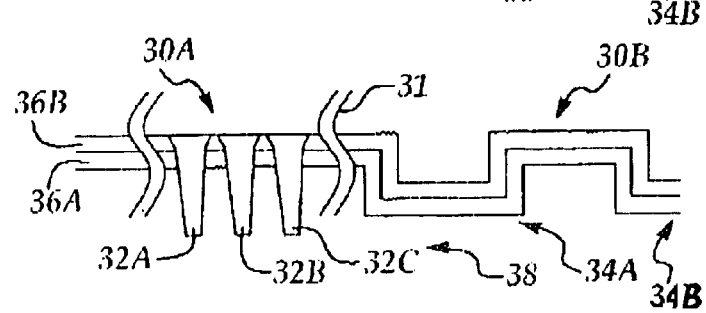

Referring to FIG. 3E, the photoresist layer 42 is subsequently removed and an oxide CMP process is carried out to remove excess STI oxide overlying the STI trenches to define the STI trenches and to planarize the wafer process surface for further processing. During the oxide CMP process, the alignment mark dummy lines e.g., 42B and the guard rings e.g., 43B serve to protect the alignment mark areas e.g., 30B from preferential polishing due to a loading effect as is known in the art where, where relatively dense feature regions polish at a relatively slower rate compared to relatively less dense feature regions thereby resulting in preferential polishing of the relatively less dense feature region, for example the alignment mark areas.

According to the present invention, such preferential polishing over alignment mark areas is avoided, thereby preserving the definition and consequently optical contrast, including signal intensity, and phase, of the alignment mark trenches and preventing damage to underlying layers susceptible to a subsequent wet etching process, for example a hot phosphoric acid etching process to remove the silicon nitride hardmask layer 36B. In a further advantage of the present invention, the thickness of a hardmask layer such as a silicon nitride or silicon oxynitride layer may be varied in design considerations, for example made thinner without being limited in design by the necessity of avoiding damage to the alignment mark areas due to preferential CMP polishing considerations over the alignment mark area. For example, as shown in the illustrated embodiment of a portion of a flash memory device design, the silicon nitride layer 36B may be made thinner to preserve an aspect ratio of the STI trenches thereby allowing a greater degree of freedom in semiconductor device design. For example, the guard rings and alignment mark dummy lines according to preferred embodiments of the invention may be applied to a variety of semiconductor device manufacturing processes where an relatively thick deposited layer is at least partially removed in a CMP planarization process over non-active areas of a wafer process surface including alignment mark areas prior to the CMP planarization process. For example, the formation of CMOS image sensors and DRAM/MIM stacked capacitor formation employ a relatively thick oxide layer that must be at least partially removed in a CMP planarization process whereby the guard rings and alignment mark dummy lines may be advantageously used according to preferred embodiments to protect alignment mark areas from undesired removal of a layer underlying the oxide layer, for example a hardmask layer, during the oxide CMP planarization process.

Figure 4:
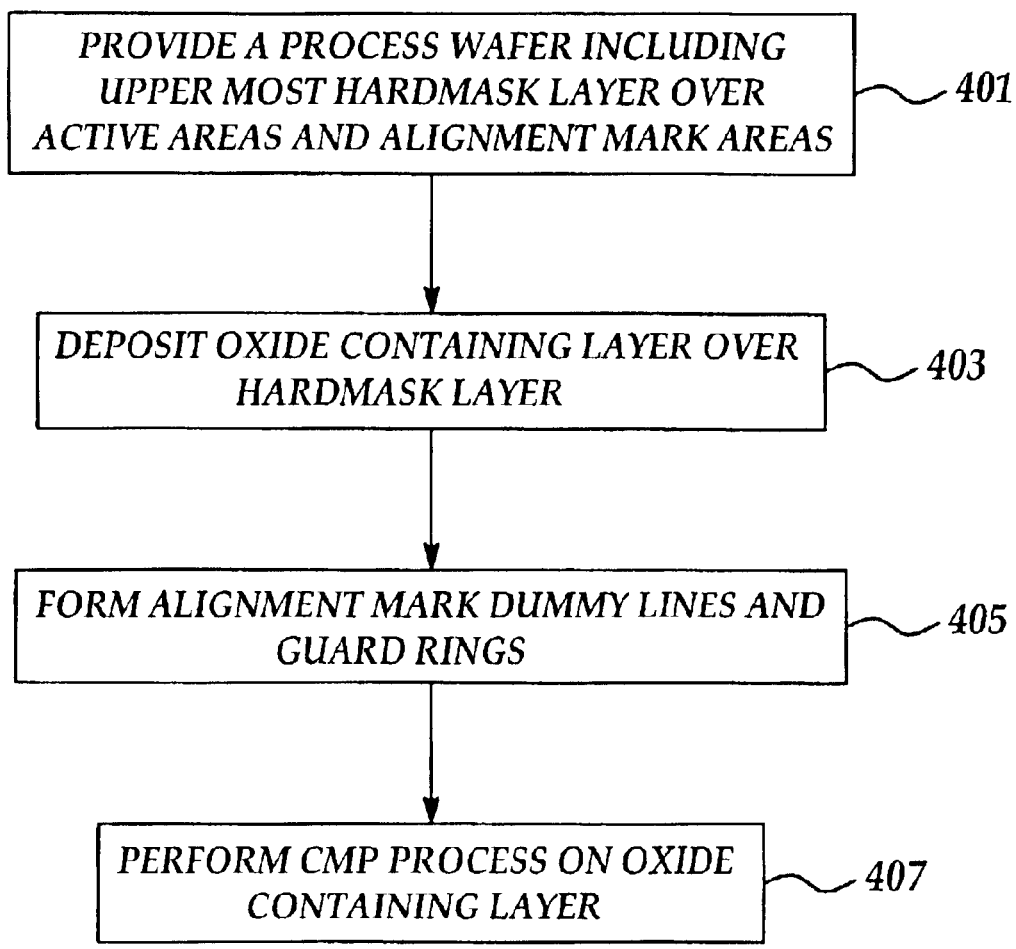
FIG. 4 is an exemplary process flow diagram including several embodiments of the present invention.

Referring to FIG. 4 is an exemplary process flow diagram including several embodiments of the present invention. In process 401, a semiconductor wafer is provided comprising an uppermost hardmask layer or CMP polishing stop layer overlying active areas and alignment mark areas. In process 403 a material layer, for example an oxide containing layer is deposited over the hardmask layer including the active areas and alignment mark areas. In process 405, a photolithographic patterning and anisotropic etching process is carried out form at least alignment mark dummy lines in the oxide containing layer in the alignment mark areas, preferably both guard rings and alignment mark dummy lines are formed according to preferred embodiments. Preferably, the anisotropic etching process to form the alignment mark dummy lines is carried out in parallel with an etching process to remove at least a portion of the oxide containing layer over non-active regions of the wafer, for example in a reverse mask etch process. In process 407, a CMP process is carried out to remove at least a portion of the oxide containing layer to planarize the active areas of the wafer.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for protecting an alignment mark area during a CMP process comprising the steps of:

forming at least a first material layer over a process surface of a semiconductor wafer comprising active areas and alignment mark trenches formed in the at least one alignment mark area;

forming at least a second material layer over the first material layer including the active areas and the at least one alignment mark area;

lithographically patterning and etching the at least a second material layer to form at least a plurality lines of the at least a second material layer adjacent to the alignment mark trenches; and, carrying out a CMP process to remove at least a portion of the at least a second material layer.

2. The method of claim 1, wherein the step of lithographically patterning and etching further comprises forming at least one guard ring surrounding the at least one alignment mark area.

3. The method of claim 2, wherein the plurality of lines and the at least one guard ring are formed having a line width of from about 0.2 microns to about 0.6 microns and a pitch of about 0.4 microns to about 1.8 microns.

4. The method of claim 1, wherein the at least a first material layer comprises a nitride containing layer and the at least a second material layer comprises an oxide containing layer.

5. The method of claim 4, wherein the nitride containing material is selected from the group of silicon nitride and silicon oxynitride and the oxide containing layer comprises silicon oxide.

6. The method of claim 1, wherein the plurality of lines are formed parallel to the alignment mark trenches extending at least one-half of the length of the alignment mark trenches.

7. The method of claim 1, wherein the plurality of lines comprises from about 2 to about 8 lines formed between alignment mark trenches.

8. The method of claim 1, wherein the step of lithographically patterning is carried out in parallel with a reverse mask etch process to remove at least a portion of the at least a second material layer over active device areas.

9. The method of claim 1, wherein the active areas comprise integrated circuit portions of devices selected from the group consisting of self-aligned floating gate flash memory, CMOS image sensors, and DRAM/MIM devices.

10. The method of claim 1, wherein the at least a first material layer comprises a nitride layer overlying a polysilicon layer.

11. The method of claim 1, wherein the step of carrying out a CMP process comprises removing in STI oxide layer over STI trenches to define oxide filled STI trenches.

12. A method for protecting an alignment mark area from optical degradation during a CMP process comprising the steps of:

forming at least a first material layer comprising a hardmask layer over a semiconductor wafer process surface comprising active areas and at least one alignment mark area comprising alignment mark trenches formed parallel to one another;

forming an oxide containing layer over the hardmask layer including the active areas and the at least one alignment mark area;

lithographically patterning and etching the oxide containing layer to form a plurality lines in the oxide containing layer disposed at least adjacently and parallel to the alignment mark trenches; and, carrying out a CMP process to remove at least a portion of the oxide containing layer.

13. The method of claim 12, wherein the step of lithographically patterning and etching further comprises forming at least one guard ring surrounding the at least one alignment mark area.

14. The method of claim 12, wherein the hardmask layer comprises a silicon nitride containing layer.

15. The method of claim 14, wherein the at least a first material layer comprises a polysilicon layer underlying the silicon nitride containing layer.

16. The method of claim 12, wherein at least a portion of the plurality of lines are formed parallel the alignment mark trenches extending at least one-half of the length of the alignment mark trenches.

17. The method of claim 12, wherein at least a portion of the plurality of lines comprises from about 2 to about 8 lines formed between the alignment mark trenches.

18. The method of claim 12, wherein the plurality of lines and are formed having a line width of from about 0.2 microns to about 0.6 microns and a pitch of about 0.4 microns to about 1.8 microns.

19. The method of claim 12, wherein the step of lithographically patterning is carried out in parallel with an etching process to remove at least a portion of the oxide containing layer over active areas.

20. The method of claim 12, wherein the active areas comprise integrated circuit portions of devices selected from the group consisting of self-aligned floating gate flash memory, CMOS image sensors, and DRAM/MIM devices.

* * * * *